(12) United States Patent
Ng et al.

(10) Patent No.: US 7,261,441 B2
(45) Date of Patent: Aug. 28, 2007

(54) LED DEVICE AND METHOD FOR DIRECTING LED LIGHT

(75) Inventors: Kee Yean Ng, Penang (MY); Teong Heng Sim, Penang (MY); Keh Chin Seah, Penang (MY); Mohammad Zamri Zainal Abidin, Penang (MY); Fakhrul Arifin Mohd Afif, Penang (MY); Noor Azian Mat Jiwa, Kedah (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 87 days.

(21) Appl. No.: 10/789,136

(22) Filed: Feb. 27, 2004

(65) Prior Publication Data

US 2005/0190561 A1 Sep. 1, 2005

(51) Int. Cl.
*F21V 7/00* (2006.01)

(52) U.S. Cl. .................. 362/307; 362/310; 362/800; 257/100; 313/512

(58) Field of Classification Search ............ 362/307, 362/310, 800; 257/100; 313/512
See application file for complete search history.

(56) References Cited

U.S. PATENT DOCUMENTS

| 6,521,916 | B2 * | 2/2003 | Roberts et al. ............. 257/100 |
| 6,686,676 | B2 * | 2/2004 | McNulty et al. ............ 313/112 |
| 2002/0084749 | A1 * | 7/2002 | Ayala et al. ................ 313/512 |

* cited by examiner

*Primary Examiner*—Stephen F Husar

(57) ABSTRACT

A LED device including a first encapsulant that at least partially encapsulates a LED and resides within a light reflecting cavity, and a second encapsulant residing above the first encapsulant—wherein the first encapsulant is partially comprised of a first percentage of a first light reflecting substance. In addition, there is provided a method for constructing a LED device.

16 Claims, 9 Drawing Sheets

LED DEVICE AND METHOD FOR DIRECTING LED LIGHT

BACKGROUND OF THE INVENTION

A LED device creates a desired light emission pattern by harnessing light emitting diode ("LED"). In doing so, such devices typically blend light emanating from the LED's upper surface (i.e., "upper LED light") with light emanating from the LED's side surface (i.e., "side LED light").

The desired light emission pattern should not only be easily viewable—because LED devices are often incorporated in traffic signals, variable message signs, and various displays—but should also be efficiently created. That is, any LED light that is not effectively harnessed in a way that contributes to the desired light emission pattern represents wasted energy.

One prior art LED device involves placing a light reflecting cavity around the LED's side surface to reflect its "side LED light" upwards so that it blends with the "upper LED light" and effectively contributes to the desired light emission pattern. However, since the percentage of "upper LED light" to "side LED light" often varies from LED to LED, a light reflecting cavity that is not specifically tailored to an individual LED is often not fully effective in blending the "upper LED light" with the "side LED light". Accordingly, such prior art devices are not fully effective in creating desired light emission patterns.

In order to address the blending limitations of light reflecting cavities, other prior art LED devices have employed a light reflecting encapsulant in conjunction with them. Such light reflecting encapsulants encapsulating the LED from the LED's base to the light reflecting encapsulant's outer surface, the latter extending significantly above the light reflecting cavity. Unfortunately, such LED devices waste a significant portion of LED light by reflecting it in undesired directions.

For example, as shown schematically in a prior art LED device 1 of FIG. 1, some of a LED's 2 light—such as light rays 5 and 7—is reflected "off track" before reaching (an example of) a desired light emission pattern 3. As is readily seen from this Figure, such light is wasted because a portion of a prior art light reflecting encapsulant 4 resides above a light reflecting cavity 8 (having a light reflecting mirror 9 on its surface). Accordingly, there is a need for a LED device and a method for directing LED light more effectively (towards a desired light emission pattern), and a method for constructing a LED device according to the present invention.

SUMMARY OF THE INVENTION

According to an embodiment of the invention, there is provided a LED device including a LED; a light reflecting cavity in which the LED resides; a first encapsulant that at least partially encapsulates the LED and resides within the light reflecting cavity; a second encapsulant residing above the first encapsulant; a first device terminal; a first connection between the first device terminal and the LED; a second device terminal; and a second connection between the second device terminal and the LED; wherein the first encapsulant is partially comprised of a first percentage of a first light reflecting substance.

Further, according to a further embodiment of the invention, there is provided a method for constructing a LED device including mounting a LED into a light reflecting cavity; connecting the LED to a first device terminal and a second device terminal; at least partially filling the light reflecting cavity with a first encapsulant which is at least partially comprised of a first percentage of a first light reflecting substance; and placing a second encapsulant above the first encapsulant.

DETAILED DESCRIPTION

Figure 2:
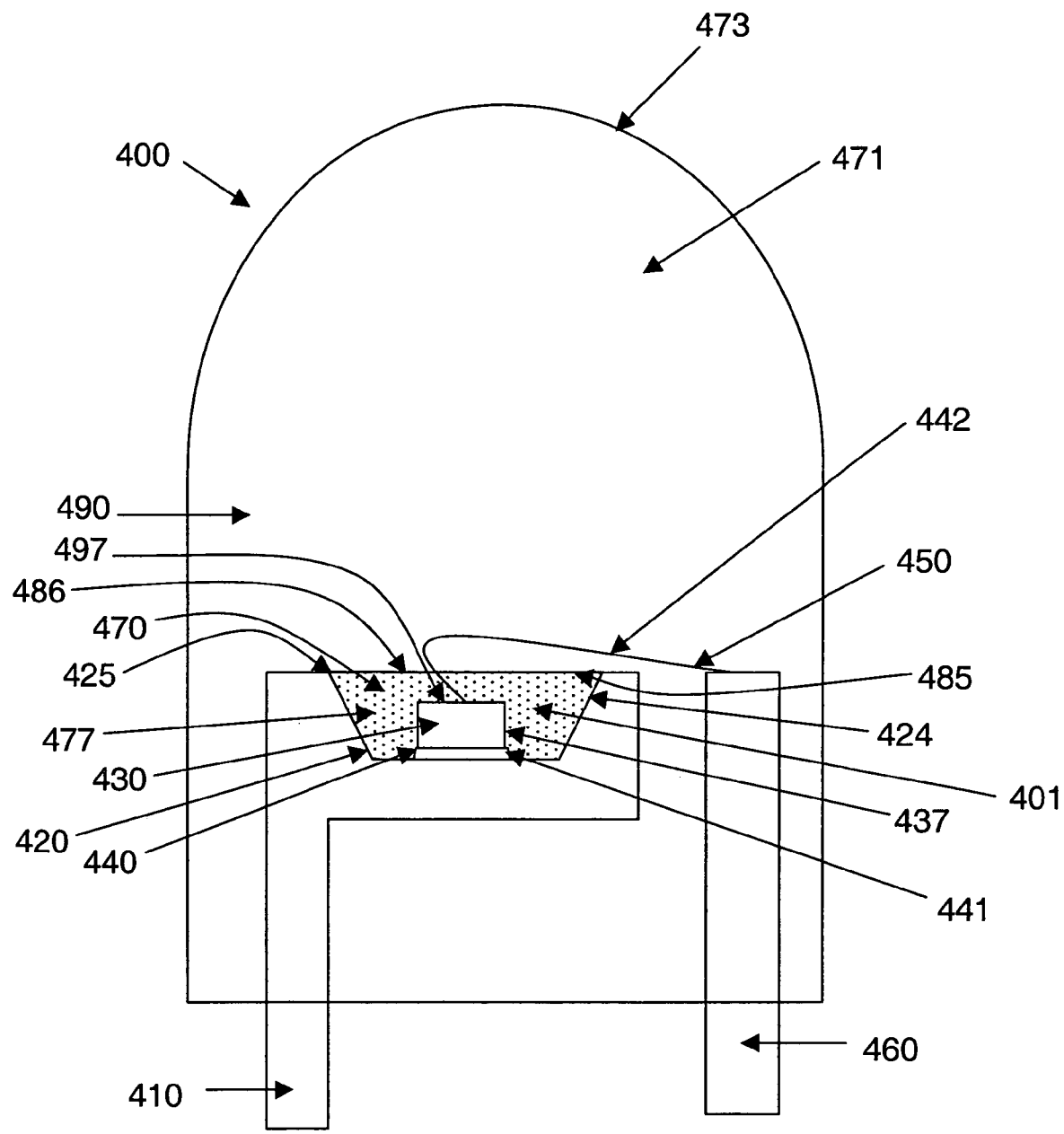
FIG. 2 is a LED device of the invention wherein a LED has a vertical design.

FIG. 2 shows a LED device 400 having a LED 430 within a light reflecting cavity 420. The light reflecting cavity 420 is comprised of a portion of a first device terminal 410; the first device terminal 410 being made of "lead frame". "Lead frame" is copper in this embodiment, and alternatively at least one of copper, steel, and nickel. In further embodiments, "lead frame" is any suitable conductor.

The light reflecting cavity 420 also includes a light reflecting coating 424 of silver. Alternatively, the light reflecting coating 424 is at least one of gold, aluminium, and nickel; and alternatively, at least two of gold, silver, aluminium, and nickel. In other embodiments, the light reflecting cavity 420 is comprised of any suitable reflective material. Moreover, in yet further embodiments, the light reflecting cavity 420 is comprised of a substance that is sufficiently reflective, and the light reflecting coating 424 is not needed.

The LED 430 is mounted inside the light reflecting cavity 420 via an electrically conductive adhesive 440 to produce a first connection 441 between the LED 430 and the first device terminal 410. In addition, a wire bond 450 provides a second connection 442 between the LED 430 to a second device terminal 460.

The electrically conductive adhesive 440 is an epoxy partially comprised of Ag (or, alternatively, other conductive substances) to render the epoxy electrically conductive. In alternative embodiments where the adhesive is non-electrically conductive, a second wire provides the first connection 441 between the LED 430 and the first device terminal 410. In yet further alternatives, the electrically conductive adhesive 440 and the second wire are both employed to provide the first connection 441.

The light reflecting cavity 420 is filled with a first encapsulant 470, which is at least partially comprised of a first light reflecting substance 401, that at least partially encapsulates the LED 430. In doing so, the first encapsulant 470 fills an area 477 between the LED 430, the light reflecting cavity 420, and a lower surface 486 of a second encapsulant 490.

Figure 3:
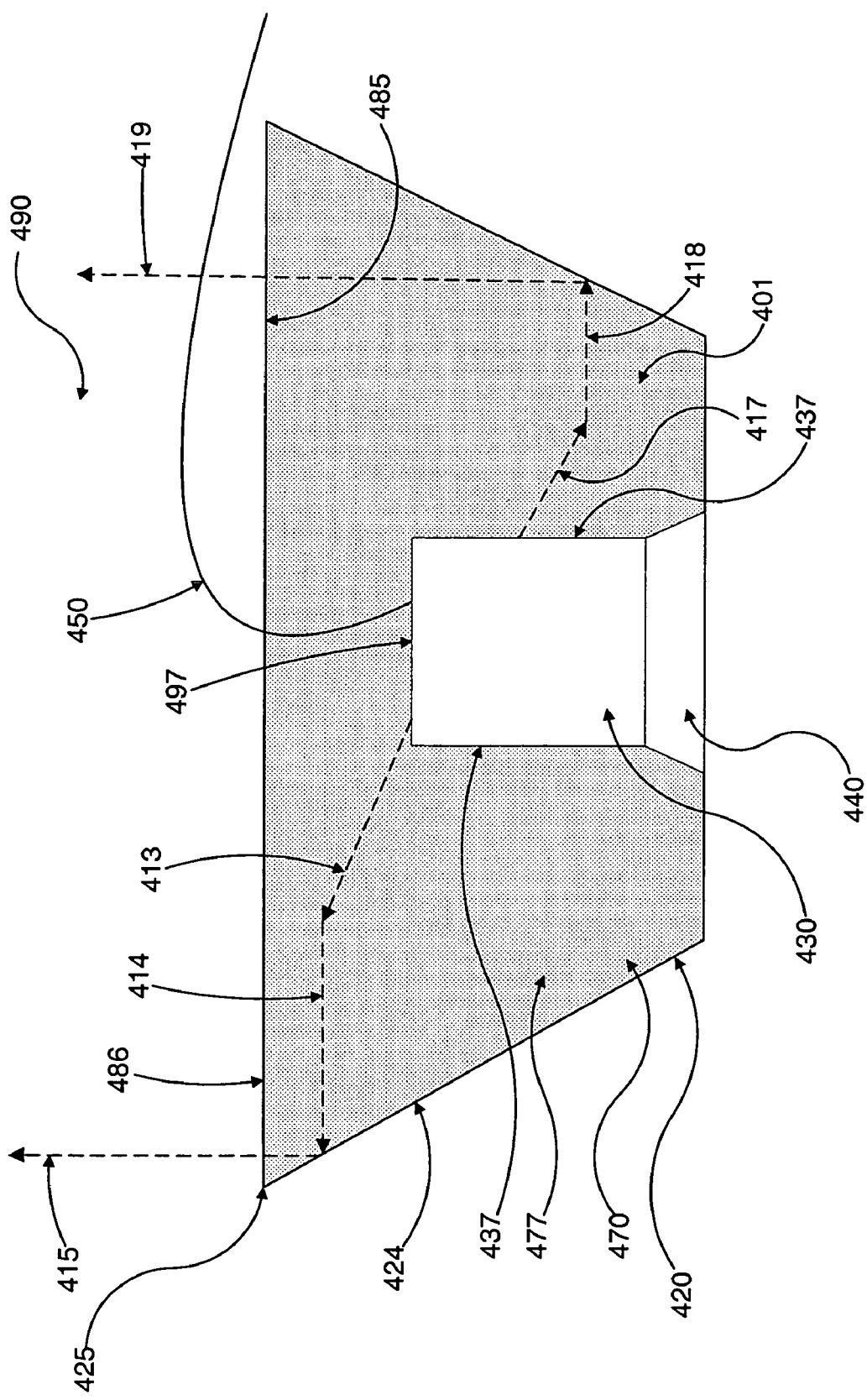
FIG. 3 is a close-up view of a light reflecting cavity of the LED device shown in FIG. 2.

In the FIGS. 2 and 3 embodiments, a depth of the light reflecting cavity 420 is greater than a height of the LED 430 (but in other embodiments, the height of the LED 430 is greater). While the depth of the light reflecting cavity 420 is 0.5 mm in FIG. 2, it is alternatively in the 0.05 mm to 3 mm range. Moreover, an upper surface 485 of the first encapsulant 470 is 0.1 mm above an upper surface 497 of the LED 430. In alternative embodiments, the upper surface 485 of the first encapsulant 470 is between 0.06 mm and 2 mm above the upper surface 497 of the LED 430, and alternatively in the 0.02 mm to 6 mm range.

Figure 4:
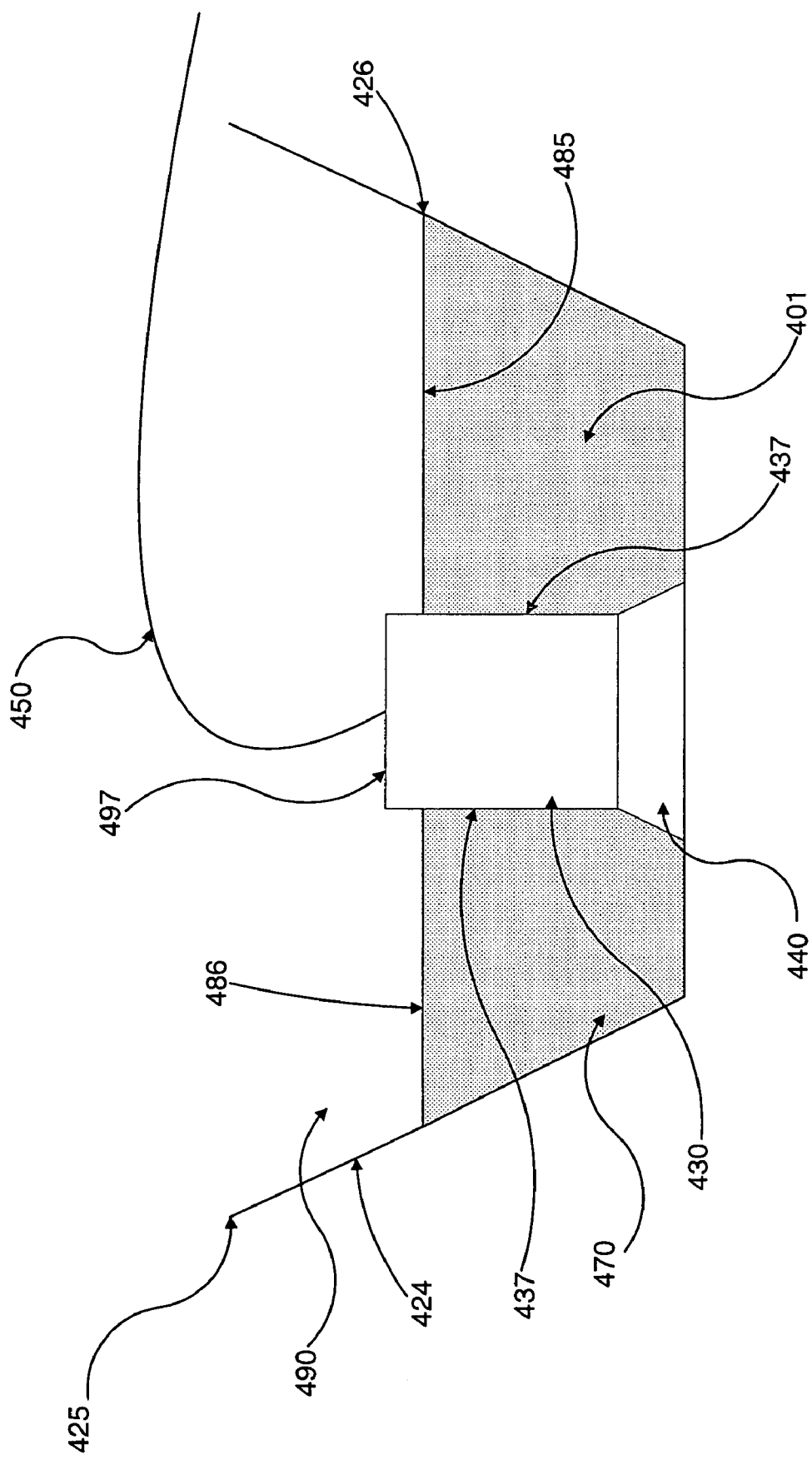
FIG. 4 is a close-up view of a light reflecting cavity of a LED device of the invention having a first encapsulant residing below an upper surface of a LED.

While in FIGS. 2 and 3 the first encapsulant 470 fills the light reflecting cavity 420 to an upper perimeter 425 of the light reflecting cavity 420 and thus fully encapsulates the LED 430, in alternative embodiments—for example, as shown in FIG. 4—the first encapsulant 470 only fills the light reflecting cavity 420 up to a non-upper perimeter 426 of the light reflecting cavity 420. Also, although the non-upper perimeter 426 is below the upper surface 497 of the LED 430 in FIG. 4, in alternative embodiments, the non-upper perimeter 426 is above the upper surface 497 of the LED 430.

In addition, it will be readily apparent to those skilled in the art that the upper surface 485 of the first encapsulant 470 is convex in FIGS. 2 and 3, and concave in FIG. 4, as a result of commonly understood principles of surface tension. In alternate embodiments, the upper surface 485 is one of: concave, convex, substantially flat, and alternative shapes readily known to those skilled in the art.

The LED device 400 also includes the second encapsulant 490 which is adjacent to, and resides above, the first encapsulant 470. As shown in FIG. 2, the second encapsulant 490 fills an area 471 between an upper surface 473 of the second encapsulant 490 and the upper surface 485 of the first encapsulant 470. Also, as shown in FIG. 2, a lower surface 486 of the second encapsulant 490 resides adjacent to and above the upper surface 485 of the first encapsulant 470. This relationship exists so that light emanating from portions of the LED 430 below the upper surface 485 are not reflected "off track" after leaving the first encapsulant and entering the second encapsulant 490 as latter does not contain any light reflecting substance in the FIG. 2 to FIG. 8 embodiments. Likewise, in embodiments (such as FIG. 9) where the second encapsulant also contains a light reflecting substance, such light is still less likely to be reflected off track as the second encapsulant always has a less light reflecting strength than the first encapsulant. Throughout this document, the term "off track" is employed to describe a situation where light is en route to a preferred light emission pattern but is taken off that path such that it does not reach the preferred light emission pattern.

In the embodiments shown in FIGS. 2 to 9, the first encapsulant 470 (570 in FIGS. 5 and 6; 670 in FIG. 7; 770 in FIG. 8; and, 970 in FIG. 9) is comprised of a base substance of epoxy, and the first light reflecting substance 401. The first light reflecting substance 401 being an inorganic filler, and specifically calcium carbonate. Specifically, the composition of the first encapsulant 470 is 97% epoxy, and 3% of the first light reflecting substance 401 (both with respect to a weight associated with the first encapsulant 470).

In an alternate embodiment, the light reflecting substance is at least one of calcium carbonate, titanium dioxide, and glass particles. Also, in further embodiments, the base substance is at least one of epoxy, silicone, and an inorganic glass material.

The first light reflecting substance 401 is generally comprised of particles with a mean size in the 20 μm to 60 μm range. Because the particles are fine, they are sufficiently suspended in the base substance without the assistance of a suspension agent.

Alternatively, bigger particles are employed in the first light reflecting substance 401. In some of these alternative embodiments, a thixotropic agent is added to help suspend the bigger particles on account of their tendency to settle downwards. Accordingly, the composition of the first encapsulant 470 is alternatively: between approximately 50% and approximately 97% of the base substance; between approximately 3% and approximately 40% of the first light reflecting substance 401; and between 0% and approximately 10% of the thixotropic agent (each relative to a weight associated with the first encapsulant 470).

The second encapsulant 490 (590 in FIG. 5; 690 in FIG. 7; and, 790 in FIG. 8) is comprised of a base substance of epoxy, is substantially optically clear, and is not filled with any light reflecting substance. Alternatively, it is comprised of at least one of silicone, and inorganic glass material. Moreover, in an additional embodiment, the second encapsulant 490 is at least two of epoxy, silicone, and inorganic glass material.

In alternative embodiments, the second encapsulant 490 contains an amount of the first light reflecting substance 401; and, alternatively, the second encapsulant 490 contains a second light reflecting substance 402 that is different from the first light reflecting substance 401. Also, a color dye is added to the second encapsulant 490 in yet other embodiments to provide a color tint. (Embodiments where the second encapsulant 490 contains a light reflecting substance are discussed at latter portions of this document.)

As best shown in FIG. 3, a portion of a light emanating from the upper surface 497 of the LED 430 (i.e., "upper LED light") is blended with a "side LED light" because the upper surface 485 of the first encapsulant 470 is above the upper surface 497 of the LED 430. For example, when an "upper light ray" (as symbolically shown as 413) emanates from the upper surface 497 of the LED 430, it is often reflected by the first encapsulant 470 to the light reflecting cavity 420 (as shown symbolically as 414), and is reflected by the light reflecting cavity 420 in the preferred upper direction (as shown symbolically as 415).

Importantly, the light ray 415 is not reflected "off track" before reaching the desired light emission pattern (not shown) above the LED device 400 because the first encapsulant 470 does not rise above the upper perimeter 425 of light reflecting cavity 420 and the second encapsulant 490 does not contain any light reflecting substance. Thus, the light ray 415 emanates out of the second encapsulant 490 (and thus out of the LED device 400) in the preferred upward direction, and, therefore, contributes to the desired light emission pattern.

A substantial portion of light emanating from the side surface 437 of the LED 430 (i.e., the "side LED light") is reflected so that it flows in the upward direction and effectively contributes to the desired light emission pattern. For instance, as also shown in FIG. 3, when a "side light ray" 417 is emitted from the LED 430, it is reflected by the first encapsulant 470, is reflected toward the light reflecting cavity 420 (as shown symbolically as 418), and is finally reflected in the desired upward direction (as shown symbolically as 419).

Since the second encapsulant 490 is not comprised of any light reflecting substance, it is not reflected "off track" by the second encapsulant 490 after leaving the first encapsulant 470. Again, this is because the second encapsulant 490 does not contain a light reflecting substance.

In alternative embodiments such as that shown in FIG. 4, the upper surface 485 of the first encapsulant 470 does not cover the upper surface 497 of the LED 430; but still covers a portion of a side surface 437 of the LED 430 (and, alternatively, substantially all of the side surface 437). In such embodiments, the "upper LED light" often emanates towards the desired light emission pattern, does not blend with the "side LED light" in the first encapsulant 470, and is likewise not reflected "off track" by the second encapsulant 490. In contrast, light emanating from the encapsulated portions of the LED 430 are mixed to achieve the desired light emission pattern, but also not reflected "off track" by the second encapsulant 490.

Figure 9:
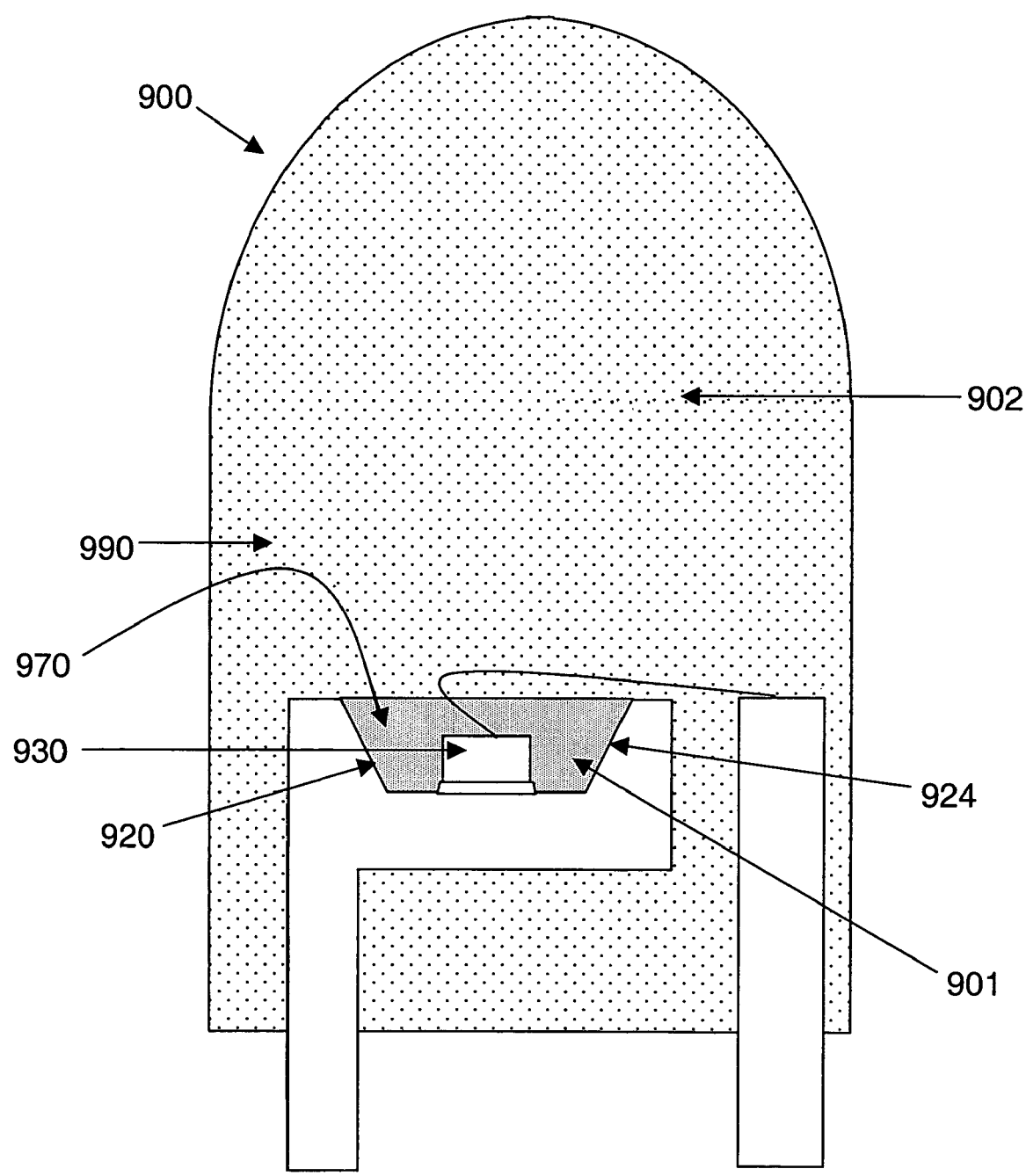
FIG. 9 is an embodiment of a LED device of the invention wherein a first encapsulant and a second encapsulant both include light reflecting substances.

That said, in further alternate embodiments, such as a LED device 900 of FIG. 9 where the second encapsulant 990 contains a second light reflecting substance 902, blending of the "upper LED light" and "side LED light" occurs in both the first encapsulant 970 and the second encapsulant 990. (Such embodiments will be discussed in more detail at latter portions of this document.)

Also, in alternate embodiments such as FIG. 4, some "side LED light" is emitted from the LED 430 without first encountering the first encapsulant 470. Nevertheless, such "side LED light" is also not reflected "off track" by the second encapsulant 490 either. Thus, it too is likely to contribute to the preferred emission pattern (not shown).

In alternate embodiments, such as the LED device 900 shown in FIG. 9, the second encapsulant 990 contains a second light reflecting substance 902. While the second light reflecting substance 902 is the same as the first light reflecting substance 901 in the first encapsulant 970, the percentage of the second light reflecting substance 902 in the second encapsulant 990 (i.e., "a second percentage") is less than the percentage of the first light reflecting substance 901 in the first encapsulant 970 (i.e., "a first percentage"). Specifically, the first percentage is 3% (of a weight associated with the first encapsulant 970), and the second percentage is 1% (of a weight associated with the second encapsulant 990). However, in other such alternative embodiments, the second percentage is between greater than 0% and less than 100% of the first percentage.

The above-described percentages of the second light reflecting substance 902 are added to the second encapsulant 990 to further blend (or, alternatively, to blend) the "upper LED light" and "side LED light" to achieve the desired LED device light emission pattern. Accordingly, the specific amount of the second light reflecting substance 902 employed in the second encapsulant 990 is, at least in part, dependent on the desired light emission pattern. Also, at least one of the following—the LED 930, the light reflecting cavity 920, the composition of the second light reflecting substance 902 employed, and the light reflecting coating 924—are also relevant factors in this regard.

Figure 1:
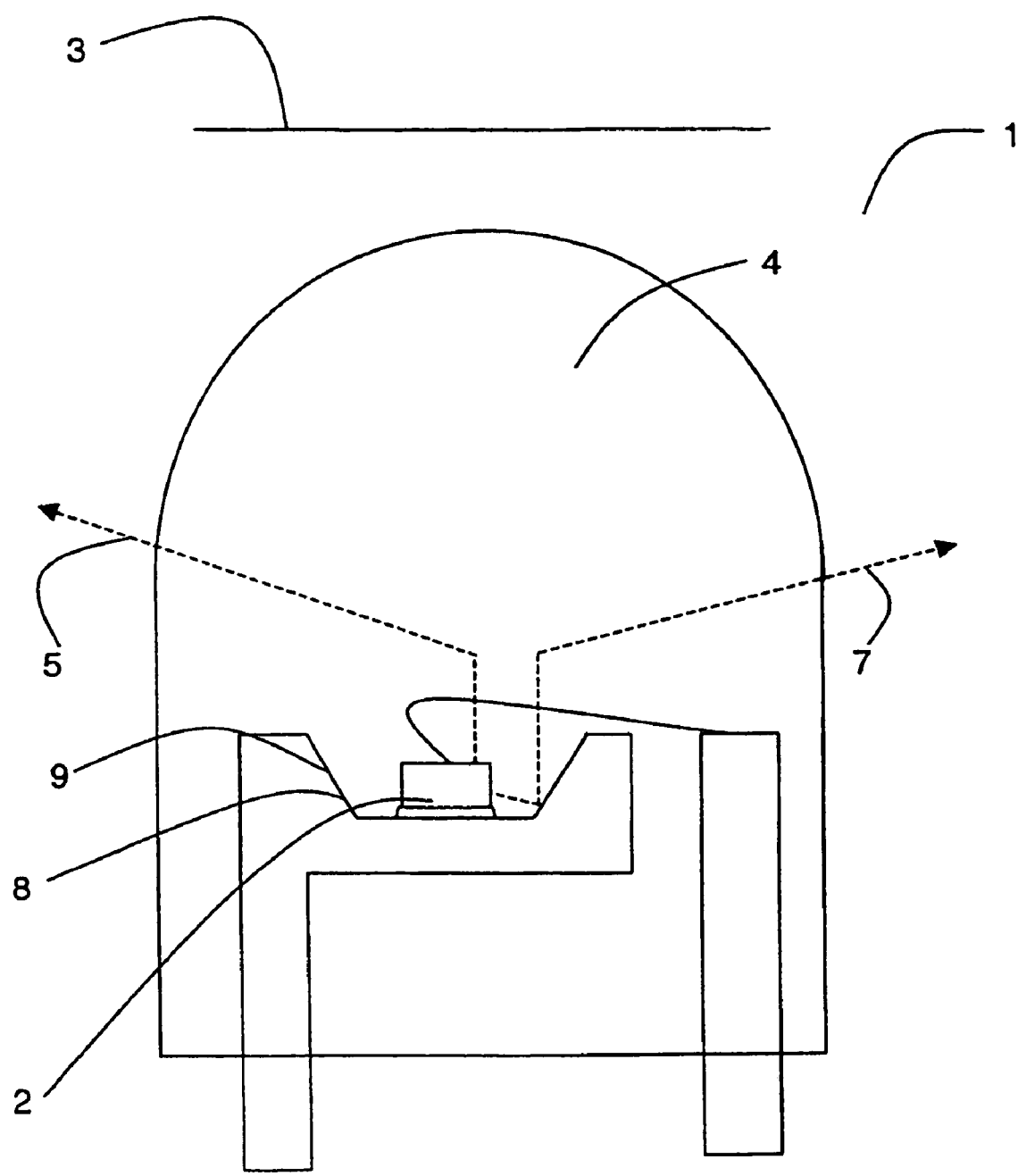
FIG. 1 is an example of a prior art LED device.

While the use of the second light reflecting substance 902 in such alternative embodiments may cause some LED light to be reflected "off track" by the second encapsulant 990, less LED light is lost "off track" relative to comparable prior art LED devices. This advantage occurs because the second percentage is less than the first percentage (assuming at least substantially identical light reflecting substances are used in the two encapsulants 970 and 990). For example, the above-desired embodiment having a 1%:3% ratio of the second light reflecting 902 substance to the first light reflecting substance 901 will reflect less light "off track" vis á vis comparable prior art LED devices (such as the prior art LED device 1 shown in FIG. 1) having only one light reflecting encapsulant (such as the prior art light reflecting encapsulant 4) containing 3% of the light reflecting substance (assuming at least substantially identical light reflecting substances are employed in the two LED devices). Thus, even in embodiments of the invention where the second encapsulant 990 contains an amount of light reflecting substance, the present invention maintains significant advantages over prior art.

Moreover, at least one of the following occurs in yet further embodiments: the light reflecting substances in the two respective encapsulants 970 and 990 are different, and the base substances in the two respective encapsulants 970 and 990 are different. For instance, while the first percentage is higher than the second percentage in some embodiments where the two encapsulants 970 and 990 contain different light reflecting substances, in other embodiments the first percentage is actually lower than the second percentage. Nevertheless, in all embodiments of the present invention, the light reflecting strength of the first encapsulant 970 is always greater than the light reflecting strength of the second encapsulant 990. Accordingly, under the same rationale set forth above, these embodiments also compare favourably vis á vis prior art LED devices.

The LED 430 has a "vertical design" in the LED device 400 shown in FIG. 2. Accordingly, the device terminals 410 and 460 are connected to opposite ends of the LED 430.

Figure 5:
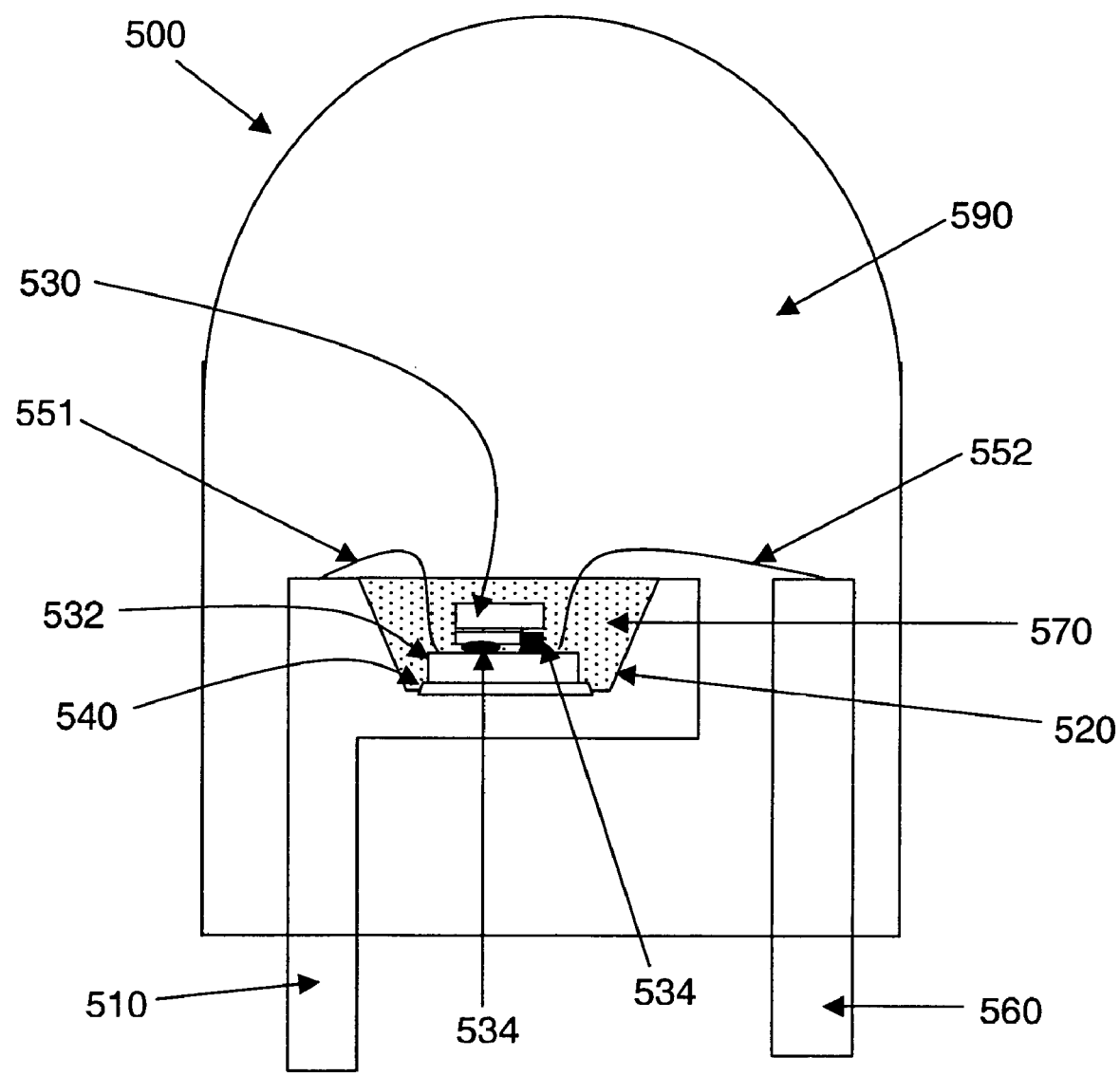
FIG. 5 is an embodiment of a LED device of the invention wherein a LED has a flip chip design.

In contrast, the FIG. 5 LED device 500 has a LED 530 with a "flip chip" design. Thus, the LED 530 is mounted on a submount 532 comprised of silicon.

Figure 6:
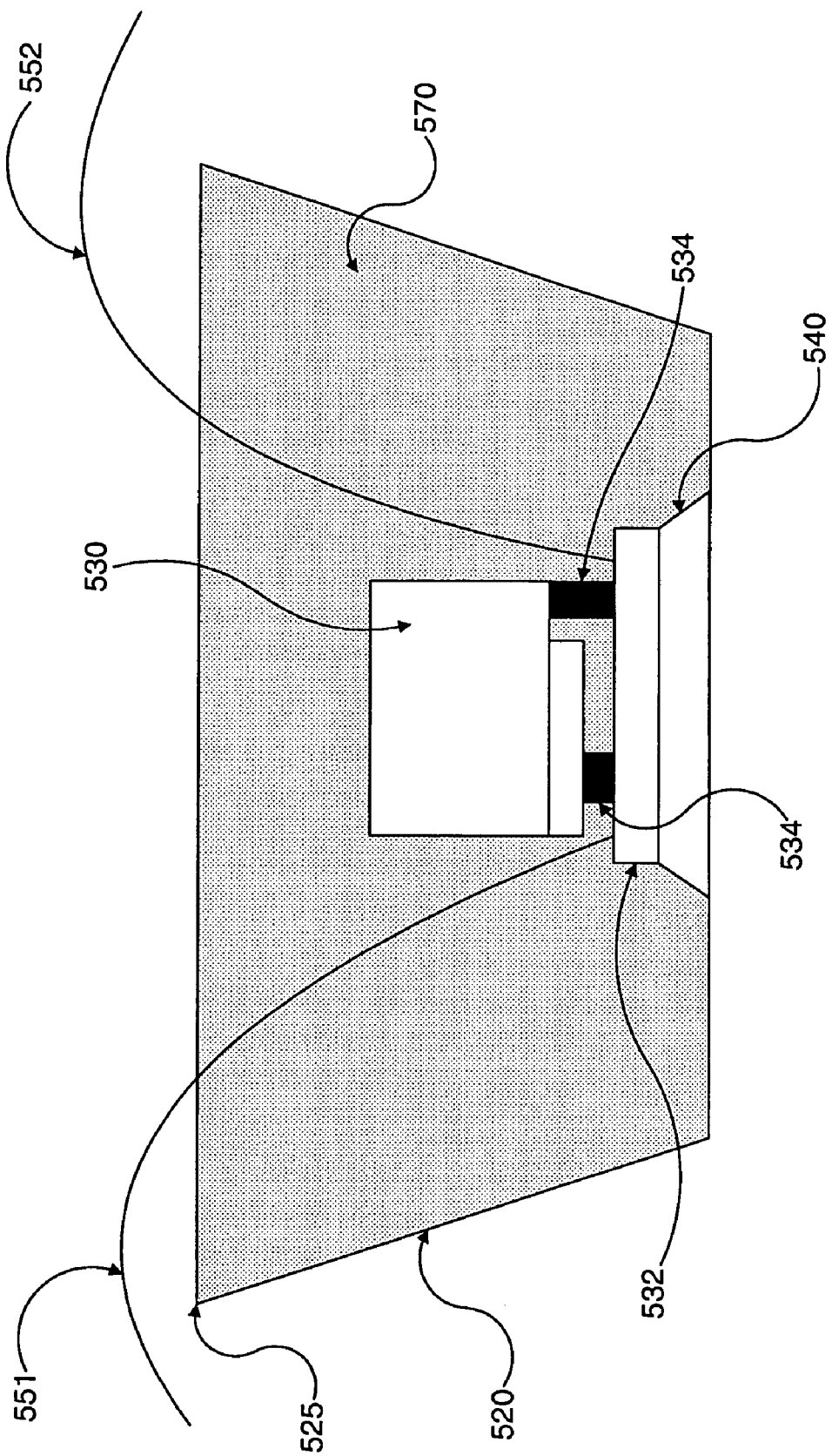
FIG. 6 is a close-up view of a light reflecting cavity of the LED device of FIG. 5.

As best shown in FIG. 6, the LED 530 is mounted on the submount 532 using a submount adhesive 534, and the submount 532 is attached to the light reflecting cavity 520 with an adhesive 540. Wire bonds 551 and 552 respectively connect the submount 532 to the first device terminal 510 and a second device terminal 560.

Figure 7:
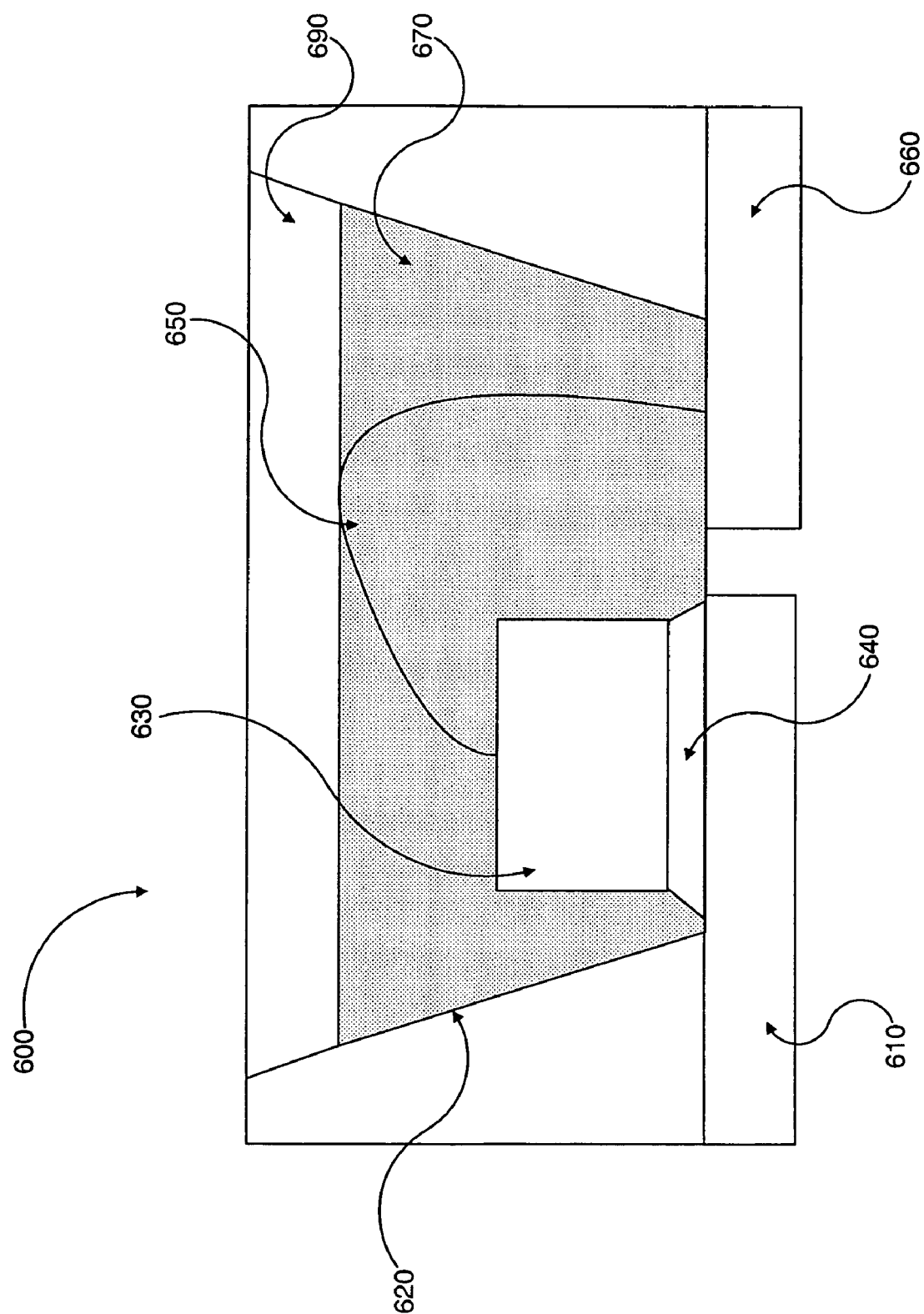
FIG. 7 is an embodiment of a LED device of the invention in a surface mount technology (SMT) design.

Finally, a surface mount technology (SMT) embodiment of a LED device 600 is shown in FIG. 7. The LED device 600 has a first device terminal 610 a second device terminal 660, both of which are made from lead frame. A LED 630 is attached to the first device terminal 610 using an adhesive 640, and a wire bond 650 connects the LED 630 to the second device terminal 660.

A light reflecting cavity 620 comprised of plastic is molded above the first and second device terminals 610 and 660. The plastic is white (or, alternatively, substantially white) and a light reflecting coating is, therefore, not necessary as it reflects light sufficiently well. Alternatively, the light reflecting cavity 620 includes a light reflecting coating of at least one of gold, silver, aluminium, and nickel.

In an alternative SMT embodiment, the light reflecting cavity 620 is made by drilling partially through a PCB; the device terminals 610 and 660 being electrically conductive traces of the PCB. Further, the light reflecting cavity 620 includes a light reflecting coating since PCB is made of glass-epoxy, and, therefore, not very reflective.

The method for constructing the LED device 400 typically includes: mounting the LED 430 into the light reflecting cavity 420; electrically connecting the LED 430 to the device terminals 410 and 460; filling the light reflecting cavity 420 with the first encapsulant 470; curing of first encapsulant 470; covering the upper surface 485 of the first encapsulant 470 with the second encapsulant 490; and curing the second encapsulant 490.

The first encapsulant 470 is liquid in nature, and is comprised of two separate parts; i.e. resin and hardener which are blended prior to use. In order to provide rigidity to the assembly, the liquid encapsulant must be hardened. This is done by subjecting the encapsulant to an elevated temperature for a period of time.

In this embodiment, curing of the first encapsulant 470 takes place at 100 degrees Celsius and takes approximately 4 hours, but alternatively may take between 30 minutes and 6 hours depending on the temperature employed and the percentage of resin and hardener used. Other alternatives will be readily known to those skilled in the art.

The curing of the second encapsulant 490 takes approximately 4 hours. However, in alternative embodiments, curing of the second encapsulant 490 takes between 30 minutes and 10 hours depending on the temperature employed and the percentage of resin and hardener used.

Figure 8:
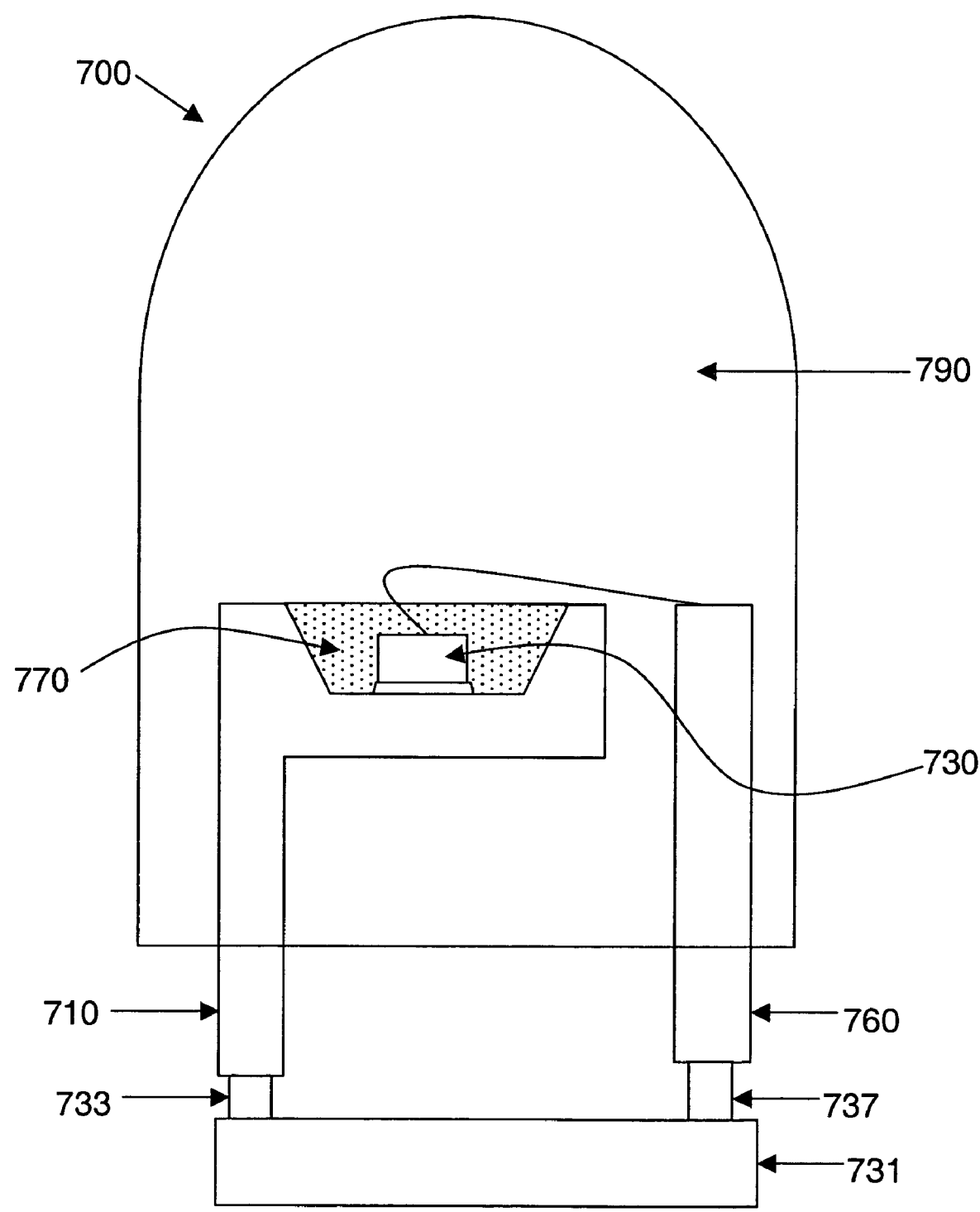
FIG. 8 is the LED device of FIG. 1 attached to a power source.

The LED 430 of the LED device 400 is ultimately connected to a power source separate from the LED device 400. Alternatively, as shown in FIG. 8, a LED device 700 includes a power source 731. The power source 731 is connected to a LED 730 via a first device terminal 710 and a second device terminal 760, and a first power source terminal 733 and a second power source terminal 737.

The power source 731 is a current source in FIG. 8. Alternatively, it is a voltage source, and in other embodiments the power source 731 is a current source and a voltage source. Moreover, such power sources and alternate power sources will be readily known to those skilled in the art.

Finally, while the embodiments of the present invention have been illustrated in detail, it should be apparent that modifications and adaptations to these embodiments may occur to one skilled in the art without departing from the scope of the present invention as set forth in the following claims.

The invention claimed is:

1. A LED device for directing light in a predetermined light emission pattern including:
   a LED;
   a light reflecting cavity in which the LED resides;
   a first encapsulant that at least partially encapsulates the LED and resides within the light reflecting cavity, the first encapsulant comprising a first percentage of a first light reflecting substance;
   a second encapsulant residing above the first encapsulant, the second encapsulant comprising a second percentage of a second light reflecting substance, the second percentage being less than the first percentage, wherein the first and second light reflecting substances reduce the occurrence of light rays that stray from the predetermined light emission pattern;
   a first device terminal;
   a first connection between the first device terminal and the LED;
   a second device terminal; and
   a second connection between the second device terminal and the LED.

2. A LED device for directing light according to claim 1 wherein a side surface of the LED is at least partially encapsulated by the first encapsulant.

3. A LED device for directing light according to claim 2 wherein a side surface of the LED is completely encapsulated by the first encapsulant.

4. A LED device for directing light according to claim 3 wherein the upper surface of the first encapsulant resides above an upper surface of the LED.

5. A LED device for directing light according to claim 1 wherein the first encapsulant fills the light reflecting cavity to an upper perimeter of the light reflecting cavity.

6. A LED device for directing light according to claim 1 wherein one of the second percentage is less than approximately one third of the first percentage and the second percentage is less than approximately one half of the first percentage.

7. A LED device for directing light according to claim 1 wherein the first encapsulant has a reflecting strength and the second encapsulant has a reflecting strength; wherein the reflecting strength of the first encapsulant is greater than the reflecting strength of the second encapsulant.

8. A LED device for directing light according to claim 1 wherein the first percentage is between 3% and 40%.

9. A LED device for directing light according to claim 1 wherein the first percentage is between 3% and 10%.

10. A LED device for directing light according to claim 1 wherein the light reflecting substance includes particles with a mean size in the range of about 20 microns to about 60 microns.

11. A LED device for directing light according to claim 1 wherein the light reflecting substance is at least one of calcium carbonate, titanium dioxide, and glass particles.

12. A LED device for directing light according to claim 1 wherein the first encapsulant includes a base substance that is at least one of epoxy, silicone, and inorganic glass material.

13. A LED device for directing light according to claim 1 wherein the composition of the first encapsulant is one of
   97% of a base substance and 3% of the first light reflecting substance with respect to a weight associated with the first encapsulant; and
   between approximately 50% and approximately 97% of a base substance; between approximately 3% and approximately 40% of the first light reflecting substance; and between 0% and approximately 10% of a thixotropic agent relative to a weight associated with the first encapsulant.

14. A LED device for directing light according to claim 1, wherein the first light reflecting substance is the same as the second light reflecting substance.

15. A method for constructing a LED device including:
   mounting a LED inside a light reflecting cavity;
   connecting the LED to a first device terminal and a second device terminal;
   at least partially filling the light reflecting cavity with a first encapsulant comprising a first percentage of a first light reflecting substance; and
   placing a second encapsulant above the first encapsulant, the second encapsulant comprising a second percentage of a second light reflecting substance, the second percentage being less than the first percentage.

16. A LED device for directing light in a predetermined light emission pattern including:
   a LED;
   a light reflecting cavity in which the LED resides;
   a first encapsulant that resides within the light reflecting cavity and at least partially encapsulates the LED, the first encapsulant comprising a light reflecting substance comprising one of a) calcium carbonate and b) titanium dioxide; and
   a second encapsulant residing above the first encapsulant, the second encapsulant containing no light reflecting substance, wherein the first and second encapsulants reduce the occurrence of light rays that stray from the predetermined light emission pattern.

* * * * *